(12) United States Patent
Yamaoka et al.

(10) Patent No.: US 6,943,559 B2
(45) Date of Patent: Sep. 13, 2005

(54) CIRCUIT PATTERN INSPECTION DEVICE, CIRCUIT PATTERN INSPECTION METHOD, AND RECORDING MEDIUM

(75) Inventors: Shuji Yamaoka, Hiroshima (JP); Shogo Ishioka, Hiroshima (JP)

(73) Assignee: OHT Inc., Hiroshima (JP)

( * ) Notice: Subject to any disclaimer, the term of this patent is extended or adjusted under 35 U.S.C. 154(b) by 29 days.

(21) Appl. No.: 10/480,106

(22) PCT Filed: Jun. 6, 2002

(86) PCT No.: PCT/JP02/05601

§ 371 (c)(1),
(2), (4) Date: Dec. 9, 2003

(87) PCT Pub. No.: WO02/101399

PCT Pub. Date: Dec. 19, 2002

(65) Prior Publication Data

US 2004/0164755 A1 Aug. 26, 2004

(30) Foreign Application Priority Data

Jun. 11, 2001 (JP) ........................................ 2001-175381

(51) Int. Cl.$^7$ .......................... H01H 31/02; G01R 27/26
(52) U.S. Cl. ........................ 324/537; 324/686; 324/690
(58) Field of Search ................................ 324/500–537, 324/686–690, 754–765, 158.1

(56) References Cited

U.S. PATENT DOCUMENTS

| 3,975,680 | A | * | 8/1976 | Webb | 324/686 |
| 4,565,966 | A | * | 1/1986 | Burr et al. | 324/519 |
| 4,733,235 | A | * | 3/1988 | Baer et al. | 324/660 |
| 5,006,808 | A | * | 4/1991 | Watts | 324/537 |
| 5,256,975 | A | * | 10/1993 | Mellitz et al. | 324/519 |

FOREIGN PATENT DOCUMENTS

| JP | 63-226688 | 9/1988 |
| JP | 05-333357 | 12/1993 |

\* cited by examiner

*Primary Examiner*—Paresh Patel
(74) *Attorney, Agent, or Firm*—Westerman, Hattori, Daniels & Adrian, LLP

(57) ABSTRACT

Disclosed is an circuit-pattern inspection apparatus comprising a power supply element 30 adapted to be capacitively coupled with a parallel array of conductive patterns 20 to supply an inspection signal to one end of each of the conductible patterns, an open sensor 40 adapted to be capacitively coupled with all of the other ends of the conductive patterns to detect the inspection signal, and a short sensor 50 arranged at a position displaced from the power supply element 30 and adapted to be capacitively coupled with two lines of the conductive patterns to detect the inspection signal. The quality of the conductive pattern is inspected such that the presence of disconnection is determined when the detect signal from the open sensor 40 is largely reduced, and the presence of short is determined when the detect signal from the short sensor 50 largely rises and then falls. The circuit-pattern inspection apparatus can detect defects in a circuit board reliably and readily.

18 Claims, 3 Drawing Sheets

CIRCUIT PATTERN INSPECTION DEVICE, CIRCUIT PATTERN INSPECTION METHOD, AND RECORDING MEDIUM

TECHNICAL FIELD

The present invention relates to an apparatus and method for inspecting the quality of conductive patterns formed on a circuit board, particularly a parallel array of conductive patterns formed on a glass substrate. The present invention also relates to a recording medium recording therein a computer program for implementing such an inspection.

BACKGROUND ART

In order to inspect the quality of conductive patterns formed on a circuit board, the presence of disconnection in the conductive patterns has been checked by bringing a signal supply probe located on one of the sides of the circuit board into contact with one of the ends of the conducting pattern to be inspected (hereinafter referred to as "target conductive pattern"), supplying an inspection signal from the signal supply probe to the target conductive pattern, and detecting the inspection signal from a sensor probe which is located on the other side of the circuit board and in contact with the other end of the target conductive pattern. In this case, if the sensor probe detects the inspection signal, it will be determined that the target conductive pattern is normal or in a conductive state. If not, it will be determined that the target conductive pattern is abnormal or in a disconnected (open) state.

In conjunction with the inspection on disconnection performed by supplying an inspection signal from one end of the target conductive pattern and detecting the inspection signal from the other end of the target conductive pattern, the presence of short between the target conductive pattern and the conductive pattern adjacent thereto has also been checked by determining if the inspection signal is detected from another sensor probe in contact with the other side's end of the adjacent pattern.

In the above conventional technique, the direct contact between the pattern and the probe causes the molecular transfer therebetween and/or scratches on the pattern, which have an adverse affect on the performance of the circuit board. Minute dusts also cause insufficient contact between the probe and the pattern, which is likely to lead to a defective inspection result such that disconnection is erroneously detected even in a normal pattern.

Further, if the shape of the circuit board is distorted due to temperature variation, it will be extremely difficult to perform an adequate probing operation, resulting in occurrence of detection errors.

Furthermore, in the conventional technique, the short between adjacent conductive patterns can be checked only if an inspection signal is supplied to only a specific conductive pattern while arranging the sensor probes in their predetermined positions. This leads to complexity in structure and inspection process.

In view of the above problems, it is therefore an object of the present invention to provide a circuit-pattern inspection apparatus and method capable of reliably inspecting a parallel array of conductive patterns in a simple structure and inspection process while minimizing constraining factors in supplying an inspection signal to the conductive patterns.

DISCLOSURE OF INVENTION

In order to achieve the above object, according to the present invention, there is provided an apparatus for inspecting a parallel array of conductive patterns formed on a board, comprising inspection-signal supply means for supplying an inspection signal to one of the ends of selected one of the conductive patterns, first detection means for detecting the inspection signal from the other end of the selected conductive pattern, second detection means for detecting the inspection signal from at least two of the adjacent conductive patterns different from the selected conductive pattern, and determination means for determining the state of the selected conductive pattern in accordance with variations in first and second inspection signals detected, respectively, from the first and second detection means.

In this apparatus, the board may be primarily made of glass, and each of the conductive patterns may have a strip-shape having a given width. In this case, the strip-shaped conductive patterns may be formed on the surface of the glass substrate at given intervals.

The second detection means may be adapted to detect the inspection signal from at least two of the conductive patterns adjacent to the selected conductive pattern.

The inspection-signal supply means may be adapted to supply the inspection signal to all of the conductive patterns individually from ones of the ends thereof.

The present invention also provides an apparatus for inspecting a parallel array of conductive patterns formed on a board, comprising, inspection-signal supply means for supplying an inspection signal to one of the ends of selected one of the conductive patterns, first detection means for detecting the inspection signal from the other end of the selected conductive pattern, second detection means for detecting the inspection signal from at least two of the conductive patterns adjacent to the selected conductive pattern, moving means for moving the first and/or second detection means relative to the conductive patterns to allow the first and/or second detection means to sequentially scan the conductive patterns, and determination means for determining the state of the conductive patterns in accordance with variations in first and second inspection signals detected, respectively, from the first and second detection means in conjunction with the relative movement according to the moving means.

In this apparatus, each of the first and second detection means may include a plate adapted to be located at a position opposed to and spaced apart from the parallel array of conductive patterns and to be capacitively coupled with the parallel array of conductive patterns in a non-contact manner so as to detect the inspection signal.

The inspection signal may be an AC signal. In this case, the inspection signal supply means may include a plate having a width less than the width of the conductive pattern and the interval between the adjacent conductive patterns, the plate being adapted to be located at a position opposed to and spaced apart from the selected conductive pattern and to be capacitively coupled with the selected conductive pattern in a non-contact manner so as to supply the AC signal to the selected conductive pattern.

The determination means may be adapted to determine the presence of short in the selected conductive pattern primarily in accordance with a detected signal from the first detection means, and the presence of disconnection in the selected conductive pattern primarily in accordance with a detected signal from the second detection means.

Further, the present invention provides a method for inspecting a parallel array of conductive patterns formed on a board, comprising: supplying an inspection signal to one of the ends of selected one of the conductive patterns;

detecting a first inspection signal from the other end of the selected conductive pattern, and detecting a second inspection signal from at least two of the adjacent conductive patterns different from the selected conductive pattern; and determining the state of the selected conductive pattern in accordance with variations in the first and second inspection signals detected, respectively, from the first and second detection means.

Furthermore, the present invention provides a method for inspecting a parallel array of conductive patterns formed on a board, comprising: supplying an inspection signal to one of the ends of selected one of the conductive patterns; detecting a first inspection signal from the other end of the selected conductive pattern, and detecting a second inspection signal from at least two of the conductive patterns adjacent to the selected conductive pattern; and sequentially scanning the conductive patterns while changing the position for detecting the first and second inspection signals to determine the state of the conductive patterns in accordance with variations in the first and second inspection signals in conjunction with the change in the canning position.

BEST MODE FOR CARRYING OUT THE INVENTION

With reference to the drawings, one embodiment of the present invention will now be described in detail. The following description will be made in conjunction with a circuit-pattern inspection apparatus for inspecting the state of a parallel array of conductive patterns formed on a circuit board, specifically a conductive-pattern inspection apparatus for inspecting the quality of a parallel array of conductive patterns formed on a back board before attached to a front board in a liquid-crystal display panel or a touch panel, by way of example.

However, the present invention is not limited to inspection of the conductive patterns as in the after-mentioned embodiment, but can be applied to inspection of any other conductive patterns arranged in an electrically isolated manner without any connection to the common pattern. Further, the present invention can be applied to inspection of conductive patterns arranged apart from each other at a distance or interval greater than the width of an after-mentioned power supply element 30, even if each of the adjacent conductive patterns has a different interval. That is, the dimension or shape of the power supply element 30 can be appropriately designed to allow the present invention to be applied to inspection of various conductive patterns arranged at any intervals.

Figure 1:
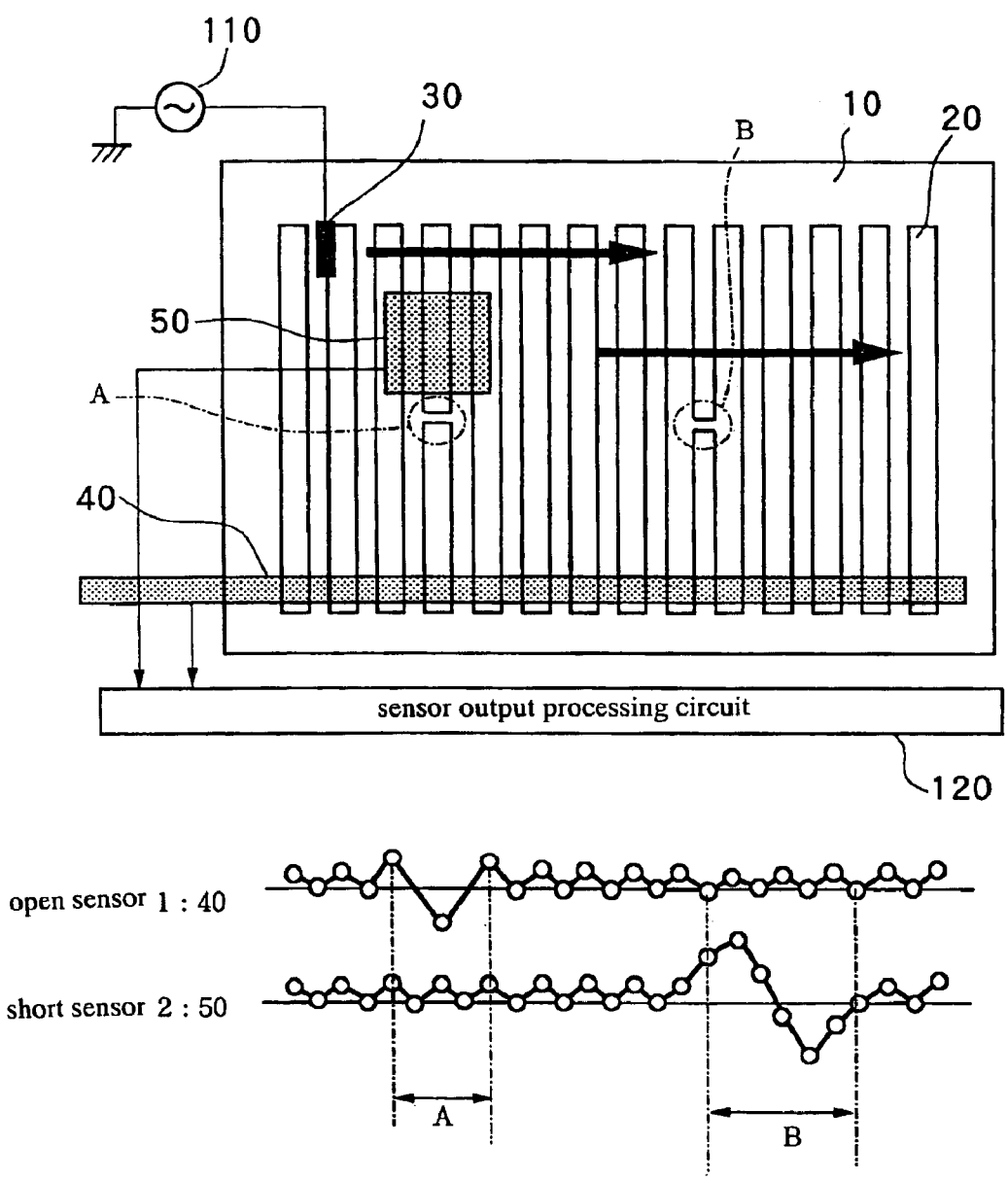
FIG. 1 is an explanatory diagram an inspection principle in a circuit-pattern inspection apparatus according to one embodiment of the present invention.

FIG. 1 is an explanatory diagram an inspection principle in the circuit-pattern inspection apparatus according to this embodiment.

In FIG. 1, the reference numeral 10 indicates a board having a parallel array of strip-shaped conductive patterns 20 to be inspected by the circuit-pattern inspection apparatus according to this embodiment. In the illustrated embodiment, the board is a glass board for use in a liquid-crystal panel or the like.

The strip-shaped conductive patterns 20 are formed on the surface of the glass board 10 to extend in the lateral direction (vertical direction in FIG. 1) of the glass board 10. As shown in FIG. 1, the adjacent conductive patterns are originally designed to have both ends independent to each other and to be electrically isolated from each other in their entireties.

However, the circuit-pattern inspection apparatus according to this embodiment is not limited to the application to inspection of such conductive patterns, but can inspect the quality of conductive patterns having the connection to the common pattern (comb-shaped pattern) in which a parallel array of conductive patterns have one ends connected with each other at a position opposed to an after-mentioned open sensor 40. In other words, the circuit-pattern inspection apparatus according to this embodiment has one feature in that it can also inspect the conductive patterns have no connection to the common pattern.

The conductive patterns 20 are arranged in approximately parallel with each other, and the respective ends of the adjacent conductive patterns are separated or electrically isolated from each other. While the conductive patterns in FIG. 1 are arranged at approximately even intervals in their entireties, ones of the ends thereof may be connected with each other as described above. Further, the intervals between the adjacent conductive patterns may be uneven, for example, the intervals between the adjacent conductive patterns may be different from each other, or each of the conductive patterns may have a different width. Even in these cases, the circuit-pattern inspection apparatus according to this embodiment can inspect the quality of such conductive patterns in accordance of the degree of the variation in detect level of an inspection signal, without any difficulties.

The reference numeral 30 indicates a power supply element formed as a flat plate having a width less than that of the conductive pattern 20 and the interval between the adjacent conductive patterns 20. The power supply element 30 is located at a position apart from the conductive patterns 20 by a given distance to supply an AC signal with a given frequency to the linear conductor patterns individually in a non-contact manner.

The power supply element 30 is connected with an inspection-signal generator 110 for generating an AC signal with a given frequency and outputting the AC signal to the power supply element 30.

The reference numeral 40 indicates an open sensor serving as first detection means for detecting whether each of the conductive patterns to be inspected, or each target conductive pattern, is in an open state (disconnected state). The open sensor 40 is formed as an elongated flat plate extending in the width direction (horizontal direction in FIG. 1) of the array of the conductive patterns and having a length to cover the entire width of the array of the conductive patterns. The open sensor 40 is located at a position apart from the conductive patterns 20 by a given distance to detect the inspection signal (AC signal with the given frequency) supplied to the target conductive pattern from the power supply element 30 through the capacitive coupling therebetween in a non-contact manner.

The reference numeral 50 indicates a short sensor serving as second detection means for detecting the presence of short between the adjacent conductive patterns. The short sensor 50 is formed to have a width approximately equal to the distance of two lines of the conductive patterns wherein the distance of one line is the sum of the width of one conductive pattern and one interval, and located at a position which is displaced from the power supply element 30 slightly in the direction of the open sensor 40, and approximately by the distance of one line in the width direction of the array of the conductive patterns 20.

The respective detect signals from the open sensor 40 and the short sensor 50 are introduced into a sensor output processing circuit 120. The sensor output processing circuit 120 is operable to amplify each of the detect signals at a given level and analyze the degree of variation in each of the detect levels. In the analysis, if the detect level for one of the conductive patterns is higher than that for others, the conductive pattern will be determined as defective.

That is, in this embodiment, the open sensor 40 is arranged such that it is capacitively coupled with all of the conductive patterns at the other ends thereof to detect an inspection signal (AC signal) flowing through any of the conductive patterns, in the form of the variation in detect level.

In an inspection operation, the deviation in detect level from the open sensor 40 is analyzed while shifting the power supply element 30 relative to the array of the conductive patterns in a direction indicated by the arrow in FIG. 1. More specifically, when the power supply element 30 is moved at a position opposed to one of the conductive patterns 20, or a target conductive pattern, it can supply to the target conductive pattern an inspection signal proportional to an opposed area between the plate of the power supply element 30 and the target conductive pattern. If the target conductive pattern has no disconnection, the supplied inspection signal will be detected by the open sensor 40. Then, when the power supply element 30 is moved at a position between the target conductive pattern and the conductive pattern adjacent thereto, only a very low level of inspection signal is supplied to the target conductive pattern, and the output of the open sensor 40 is reduced.

At the position opposed to the target conductive pattern, if the target conductive pattern has a disconnected portion, as indicated by A in FIG. 1, the supplied inspection signal does not flow beyond the disconnected portion, and thus the detect level from the open sensor 40 will be reduced. Thus, when the output of the open sensor is largely reduced, it can be determined that the target conductive pattern corresponding to the output is in an open (disconnected) state.

In case where the target conductive pattern is short-circuited to the adjacent conductive pattern, or in a short state, as indicated by B in FIG. 1, even if the inspection signal supplied to the target conductive pattern also flows to the adjacent pattern, it will arrive at the open sensor 40 through the target conductive pattern. Thus, while the detect level is likely to be slightly reduced, it is maintained substantially at a normal level. Therefore, it is difficult to detect both disconnection and short in the conductive patterns with high reliability only by using the open sensor 40.

From this point of view, the circuit-pattern inspection apparatus according to this embodiment is provided with the short sensor 50 which is located at a position displaced from the power supply element 30 and formed to have a width approximately equal to the distance of two lines of the linear conducting lines. The width of the short sensor 50 is not limited to the distance of two lines, but may be designed to be a distance of three or more lines.

The short sensor 50 is fixed, for example, to a sensor panel, in such a manner that the edge of the short sensor 50 on the upstream side relative to the moving direction (that is opposite direction of the arrow in FIG. 1) of the glass board 10 is located at a position displaced from the power supply element 30 by the distance of one lines in the width direction of the array of the conductive pattern. As described later, the short sensor 50 is likely to detect an inspection signal through the open sensor 40. Thus, it is desired that the short sensor 50 is located as far as possible from the open sensor 40 or at a position close to the power supply element 30.

In this embodiment including the short sensor 50 constructed as in FIG. 1, when an inspection signal supplied to one of the ends of the conductive pattern 20 to be inspected, or a target conductive pattern, flows toward the other end of the target conductive pattern and arrives at the open sensor 40 if it is in a normal state. Since the open sensor 40 is capacitively coupled with all of the conductive patterns, the inspection signal partly flows to the conductive patterns adjacent to the target conductive pattern through the open sensor 40.

Then, the inspection signal partially arrives at the short sensor 50 through the adjacent conductive patterns, and the short sensor 50 sends a detect signal to the sensor output processing circuit 120. Thus, when the target conductive pattern is in a normal state, the inspection signal supplied from the power supply element 30 to the target conductive pattern is not directly but indirectly by the short sensor 50.

Even if a part of the conductive patterns opposed to the short sensor 50 is in a disconnected state, the detect level of the short sensor 50 will not be significantly changed because the inspection signal is supplied through the remaining normal conductive pattern.

If the conductive pattern supplied with an inspection signal from the power supply element 30, or a target conductive pattern, is short-circuited (B in FIG 1.) to the adjacent conductive pattern on the downstream side relative to the moving direction of the glass board 10, the inspection signal from the power supply element 30 will also be supplied to the adjacent conductive pattern through the short-circuited portion.

In this case, the short sensor 50 electrically connected directly with the target detects the inspection signal at a higher level than that in the normal state when the inspection signal is supplied through the open sensor 40. Thus, as shown in the bottom of FIG. 1, the detect level is largely increased. Then, when the short sensor 50 is moved beyond the short-circuited conductive patterns, and only the power supply element 30 is opposed to the upstream short-circuited conductive pattern, the detect level is reversely reduced, because an inspection signal from the power supply element 30 to the upstream short-circuited conductive pattern also flows to the downstream short-circuited conductive pattern.

Therefore, the arrangement of the open sensor 40 and the short sensor 50 as shown in FIG. 1 allows both disconnection and short in a parallel array of conductive patterns to be detected in a simple structure.

One example of the detect signal of the open sensor 40 is shown in the bottom of FIG. 1. In a normal state, the open sensor 40 outputs a detect signal proportional to an opposed area between the power supply element 30 and one of the conductive patterns 20 or a target conductive pattern. If the target conductive pattern is in an open state (disconnected state), the inspection signal from the power supply element 30 will be insufficiently detected, and the level of a detect signal corresponding to the target conductive pattern in the open state will have a lower level. Such a detect signal is indicated by A in FIG. 1.

Even if the target conductive pattern is short-circuited as indicated by B in FIG. 1, the energy of the inspection signal arriving at the open sensor 40 will not be significantly changed.

In the short sensor 50 provided in this embodiment, the detect level of the short sensor 50 is not significantly changed when the target conductive pattern is in a disconnected state. In contrast, if the target conductive pattern is in a short state, the short sensor 50 can detect the short state in the form of the variation in detect level such that it initially rises and then falls.

Figure 2:
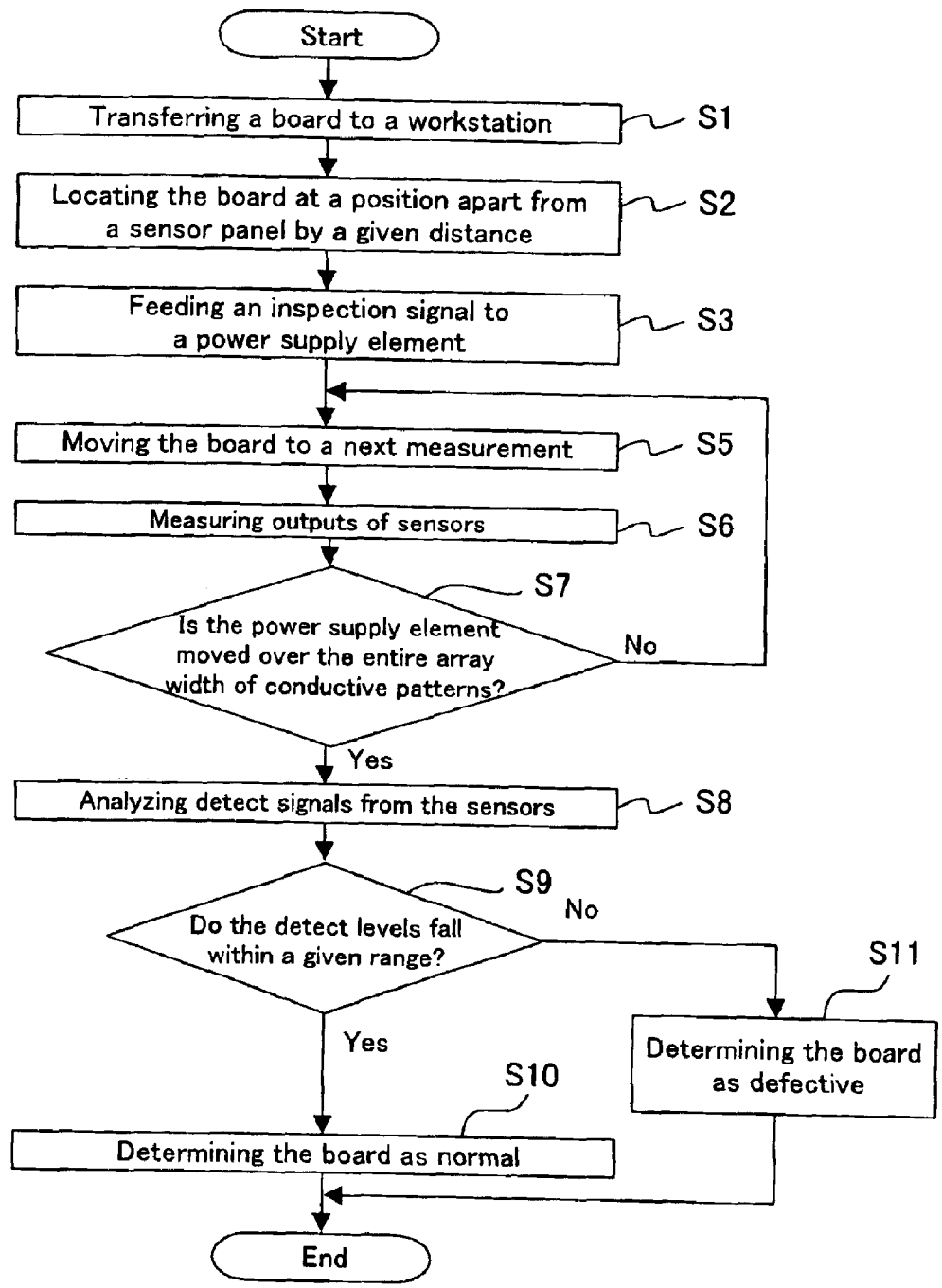
FIG. 2 is an explanatory flowchart of an inspection process using the circuit-pattern inspection apparatus according to the embodiment.

With reference to the flowchart in FIG. 2, an inspection process using the circuit-pattern inspection apparatus according to the above embodiment will be described below.

In the following description, the inspection is directed to a parallel array of conductive patterns made of a conductive material (e.g. gold, copper, aluminum or ITO) and formed on the surface of a glass board, as shown in FIG. 1, by way of example. In Step S1, the glass board formed with the conductive patterns is transferred along a transfer line (not shown) to a location of the circuit-pattern inspection apparatus (workstation for inspection).

In Step S2, the board transferred to the workstation is held by a jig or a stage for mounting the board (not shown).

The jig is constructed such that it can be 3-dimensionally positioned in accordance with a 4-axis control of X Y Z and angle θ. According to the jig, the board is located at a position apart from a sensor panel by a given distance. For example, in FIG. 1, the power supply element 30 is located at a position opposed to the left edge of leftmost one of the conductive patterns 20.

After the positioning of the board is completed as above, the AC signal generator 110 is controlled to feed an AC signal (inspection signal) with a given frequency to the power supply element 30, in Step S3.

Then, in Step S5, the board is moved such that the power supply element 30 is shifted from the position opposed to the leftmost conductive pattern to respective positions opposed to the remaining conductive patterns, in turn in the arrow direction in FIG. 1. Simultaneously, in Step S6, the sensor output processing circuit 120 is operable to amplify detect signals from the open sensor 40 and the short sensor 50 up to a given signal level though an amplifier circuit, detect the respective outputs of the open sensor 40 and the short sensor 50 in a time division manner through a multiplexer circuit or the like, convert the time-divided signal into a digital signal, and store the digital signal in an internal memory (not shown).

Then, in Step S7, it is checked whether the board is moved at a distance equal to the entire width of the array of the conductive patterns. If the moving distance of the board is less than the entire array width, the process will return to Step S5, and the inspection will continue.

When the moving distance of the board becomes equal to the entire array width in Step S7, the process will advance to Step S8. In Step S8, the detect signals from the open sensor 40 and the short sensor 50 is analyzed by checking the variation in level thereof.

Then, in Step S9, it is checked whether all of the analyzed levels of the detect signals corresponding to the respective conductive patterns fall within a given range. For example, when all of the levels of the detect signals fall within the given range, all of the conductive patterns on the board is determined as normal, and the process is completed. Then, after the board is moved downward to a transfer position, it is placed on the transfer line, and transferred to a subsequent station. If the inspection is continuously performed, the process will be re-started from Step S2 when a new board is transferred to the workstation.

If, in Step S9, the detected signals include a level beyond the given range, for example, the large variation in detect level as indicated by A or B in FIG. 1, the process will advance to Step S11. In Step S11, the board is determined as defective, and the process is completed. After the board is moved downward to a transfer position, the board is placed on the transfer line to transfer it to a subsequent station or took out of the transfer line.

According to the above inspection process, even if the conductive patterns have ends separated or electrically isolated from each other, the detect level of the open sensor 40 is distinctively reduced when one of the conductive patterns is in a disconnected (open) state. Further, when one of the conductive patterns is in a short-circuited (short) state, the detect level of the open sensor 40 initially rises and then falls. Thus, the quality of the conductive patterns can be recognized without any difficulties.

Figure 3:
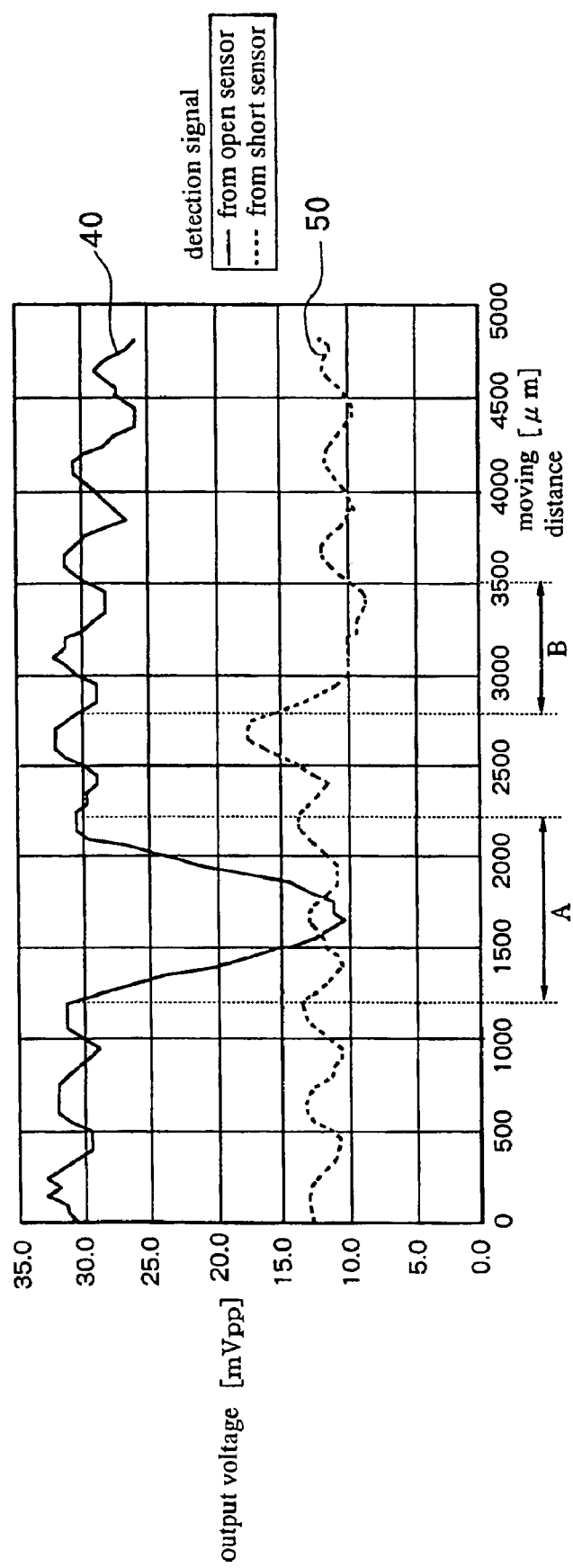
FIG. 3 is a graph showing one example of the result of inspection using the circuit-pattern inspection apparatus according the embodiment.

FIG. 3 shows one example of the result of actual inspection of the above conducting patterns using the circuit-pattern inspection apparatus according to the above embodiment.

In FIG. 3, an upper curve is a detect signal from the open sensor 40, and a lower curve is a detect signal from the short sensor 50.

In FIG. 3, the range indicated by A shows the detection curve of the conductive pattern in a disconnected (open) state, and the range indicated by B shows the detection curve of the conductive pattern in a short-circuited (short) state. Both the detection curves of the defective conductive patterns are significantly different from those of the normal conductive patterns, so that the defective conductive patterns can be distinctively recognized without any difficulties.

If some noise is mixed with the detect signals from the sensors, both the detection curves of the sensors will simultaneously have a large variation in most cases. This case can be clearly distinguished from the above inspection result in which one of the detection curves is largely changed.

While the board in the above description is formed with only one of the parallel array of conductive patterns as shown in FIG. 1, a board may be formed with a plural number of the pattern arrays, and divided into a plurality of boards in a subsequent production process. In an inspection for such a board, a set of the power supply element and the open/short sensors is preferably provided to each of the pattern arrays. The sensor output processing circuit 120 can be used for all of the pattern arrays in common by processing respective detect signals from the sensors in a time division manner.

For example, a plural number of the pattern arrays are formed on a single board, several arrays may be arranged lengthwise and crosswise. It is understood that the present invention is not limited to inspection of the parallel array of conductive patterns arranged as shown in FIG. 1, but may be applied to a large panel formed with a number of the pattern arrays in a matrix arrangement.

INDUSTRIAL APPLICABILITY

As mentioned above, according to the present invention, defects in conductive patterns can be reliably detected.

In addition, the state or factor of the defect can be readily recognized in accordance with two detect signals from open and short sensors. Even if the two detect signals include noises, such noises can be readily distinguished by comparing the two detect signals.

What is claimed is:

1. An apparatus for inspecting a parallel array of conductive patterns formed on a board, comprising:

inspection-signal supply means for supplying an inspection signal to one of the ends of selected one of said conductive patterns;

first detection means for detecting said inspection signal from the other end of said selected conductive pattern;

second detection means for detecting said inspection signal from at least two of the adjacent conductive patterns different from said selected conductive pattern; and determination means for determining the state of said selected conductive pattern in accordance with variations in first and second inspection signals detected, respectively, from said first and second detection means.

2. The apparatus as defined in claim 1, wherein said board is primarily made of glass, and each of said conductive patterns has a strip-shape having a given width, wherein said strip-shaped conductive patterns are formed on the surface of said glass substrate at given intervals.

3. The apparatus as defined in claim 1, wherein said second detection means is adapted to detect said inspection signal from at least two of the conductive patterns adjacent to said selected conductive pattern.

4. The apparatus as defined in either one of claims 1 to 3, wherein said inspection-signal supply means are adapted to supply the inspection signal to all of said conductive patterns individually from ones of the ends thereof.

5. An apparatus for inspecting a parallel array of conductive patterns formed on a board, comprising:

inspection-signal supply means for supplying an inspection signal to one of the ends of selected one of said conductive patterns;

first detection means for detecting said inspection signal from the other end of said selected conductive pattern;

second detection means for detecting said inspection signal from at least two of the conductive patterns adjacent to said selected conductive pattern;

moving means for moving said first and/or second detection means relative to said conductive patterns to allow said first and/or second detection means to sequentially scan said conductive patterns; and determination means for determining the state of said conductive patterns in accordance with variations in first and second inspection signals detected, respectively, from said first and second detection means in conjunction with said relative movement according to said moving means.

6. The apparatus as defined in claim 1 or 5, wherein each of said first and second detection means includes a plate adapted to be located at a position opposed to and spaced apart from said parallel array of conductive patterns and to be capacitively coupled with said parallel array of conductive patterns in a non-contact manner so as to detect said inspection signal.

7. The apparatus as defined in claim 6, wherein said inspection signal is an AC signal, wherein said inspection signal supply means includes a plate having a width less than the width of said conductive pattern and the interval between the adjacent conductive patterns, said plate being adapted to be located at a position opposed to and spaced apart from said selected conductive pattern and to be capacitively coupled with said selected conductive pattern in a non-contact manner so as to supply said AC signal to said selected conductive pattern.

8. The apparatus as defined in claim 7, wherein said determination means is adapted to determine the presence of short in said selected conductive pattern primarily in accordance with a detected signal from said first detection means, and the presence of disconnection in said selected conductive pattern primarily in accordance with a detected signal from said second detection means.

9. A method for inspecting a parallel array of conductive patterns formed on a board, comprising:

supplying an inspection signal to one of the ends of selected one of said conductive patterns;

detecting a first inspection signal from the other end of said selected conductive pattern, and detecting a second inspection signal from at least two of the adjacent conductive patterns different from said selected conductive pattern; and determining the state of said selected conductive pattern in accordance with variations in said first and second inspection signals detected, respectively, from said first and second detection means.

10. The method as defined in claim 9, wherein said board is primarily made of glass, and each of said conductive patterns has a strip-shape having a given width, wherein said strip-shaped conductive patterns are formed on the surface of said glass substrate at given intervals.

11. The apparatus as defined in claim 9, wherein said second inspection signal is detected from at least two of the conductive patterns adjacent to said selected conductive pattern.

12. The apparatus as defined in either one of claims 9 to 11, wherein said inspection signal is supplied to all of said conductive patterns individually from ones of the ends thereof.

13. A method for inspecting a parallel array of conductive patterns formed on a board, comprising:

supplying an inspection signal to one of the ends of selected one of said conductive patterns;

detecting a first inspection signal from the other end of said selected conductive pattern, and detecting a second inspection signal from at least two of the conductive patterns adjacent to said selected conductive pattern; and sequentially scanning said conductive patterns while changing the position for detecting said first and/or second inspection signals to determine the state of said conductive patterns in accordance with variations in said first and/or second inspection signals in conjunction with the change in said canning position.

14. The method as defined in claim 9 or 13, wherein each of said first and second inspection signals is detected through a plate located at a position opposed to and spaced apart from said parallel array of conductive patterns and capacitively coupled with said parallel array of conductive patterns in a non-contact manner.

15. The method as defined in claim 14, wherein said inspection signal is an AC signal, wherein said AC signal is supplied to said selected conductive pattern through a plate having a width less than the width of said conductive pattern and the interval between the adjacent conductive patterns, said plate being located at a position opposed to and spaced apart from said selected conductive pattern and capacitively coupled with said selected conductive pattern in a non-contact manner.

16. The method as defined in either one of claims 1 to 5, wherein the presence of short in said selected conductive pattern is determined primarily in accordance with said first inspection signal detected from said first detection means, and the presence of disconnection in said selected conductive pattern is determined primarily in accordance with said second inspection signal detected from said second detection means.

17. A recording medium recording therein a computer program for achieving the method as defined in claim 9 or 13 under computer control.

18. A computer program sequence for achieving the method as defined in claim 9 or 13 under computer control.

* * * * *